United States Patent [19]
Xin et al.

[11] Patent Number: 5,747,425
[45] Date of Patent: May 5, 1998

[54] HIGH $T_c$ SUPERCONDUCTOR MAGNETIC SHIELDS AND METHOD OF MAKING SAME

[75] Inventors: Ying Xin; Wangsong He, both of Lawrence; Michael S. P. Lucas, Manhattan; Xin Fei, Lawrence, all of Kans.; Yi-Han Kao, Williamsville, N.Y.

[73] Assignee: Midwest Superconductivity Inc., Lawrence, Kans.

[21] Appl. No.: 726,623

[22] Filed: Oct. 7, 1996

Related U.S. Application Data

[63] Continuation of Ser. No. 281,611, Jul. 28, 1994, abandoned, which is a continuation-in-part of Ser. No. 101,574, Aug. 3, 1993, abandoned.

[51] Int. Cl.⁶ .......................... H05K 9/00; H01L 39/00
[52] U.S. Cl. .......................... 505/150; 505/490; 505/492; 505/739; 427/62; 174/35 R; 338/32 S
[58] Field of Search .................. 505/150, 739, 505/490, 492, 501; 427/62; 338/32 S; 174/35 R

[56] References Cited

U.S. PATENT DOCUMENTS

| | | | |
|---|---|---|---|
| 4,957,901 | 9/1990 | Jacobson et al. | 505/491 |
| 5,145,833 | 9/1992 | Prunier, Jr. | 505/491 |
| 5,187,327 | 2/1993 | Ohta et al. | 505/162 |
| 5,204,316 | 4/1993 | Arendt et al. | 505/1 |
| 5,258,573 | 11/1993 | Sugioka et al. | 505/211 |
| 5,273,956 | 12/1993 | Johnson et al. | 505/1 |
| 5,284,823 | 2/1994 | Chou et al. | 505/491 |

FOREIGN PATENT DOCUMENTS

| | | |
|---|---|---|
| 63-274652 | 11/1988 | Japan . |
| 02-228099 | 9/1990 | Japan . |
| 03-153559 | 7/1991 | Japan . |
| 03-193605 | 8/1991 | Japan . |
| 9310047 | 5/1993 | WIPO . |

OTHER PUBLICATIONS

Hussain et al.; Cryogenics 1992, vol. 32, No., pp. 64–68.
Miller et al.; Cryogenics 1993, vol. 33, No. 2, pp. 180–183.
Yahara et al.; IEEE ransactons on Magnetics, vol. 25, No. 2, Mar. 1989, pp. 2498–2501.
Macfarlane et al.; Cryogenics 1988, vol. 28, May, pp. 303–306.
Symko et al.; J. Appl. Phys. 65 (5), 1 Mar. 1989. pp. 2142–2144.

*Primary Examiner*—Roy V. King
*Attorney, Agent, or Firm*—Hovey, Williams, Timmons & Collins

[57] ABSTRACT

High $T_c$ superconducting magnetic shields are provided, together with a method of fabricating such shields, wherein the shields exhibit very high critical applied magnetic field values of at least about 50 Gauss at 77 K. In fabrication procedures, a particulate superconducting ceramic oxide (24) (e.g., thallium 2223) is placed within an uniaxial die assembly (10) and subjected to compression while the die is heated via an external heating jacket (26). After formation of a self-sustaining body (24a), the die (10) is additionally heated via the jacket (26). External heating of the die (10) with the superconducting material therein reduces internal stresses within the shield body.

31 Claims, 5 Drawing Sheets

HIGH $T_C$ SUPERCONDUCTOR MAGNETIC SHIELDS AND METHOD OF MAKING SAME

RELATED APPLICATION

This application is a continuation of Ser. No. 08/281,611, filed Jul. 28, 1994, now abandoned, which is a continuation-in-part of application Ser. No. 08/101,574, filed Aug. 3, 1993, now abandoned.

BACKGROUND OF THE INVENTION

1. Field of the Invention

The present invention is broadly concerned with improved superconducting magnetic shields having extraordinarily high critical applied magnetic field values of at least about 50 Gauss at 77 K, as well as powder molding methods of fabricating such shields. More particularly, the invention pertains to shields made by a powder molding process wherein finely divided superconducting ceramic material is preferably treated in an externally heated die so as to reduce internal stresses within the final shield. The invention also involves a method for the production of tubular shields without the need for die heating.

2. Description of the Prior Art

Superconducting materials exhibit unique physical properties which are useful for effectively shielding (i.e., preventing penetration of) external magnetic, electric and electromagnetic fields. The characteristic shielding property of superconductors arises as a function of an inherent but measurable parameter of the superconductor, which can be termed the "critical shielding current density." In order to understand the shielding phenomenon, consider that when a superconducting material is sufficiently cooled below its critical temperature ($T_c$), it exhibits zero electric resistivity and is essentially diamagnetic. Therefore an external field acting on the cooled superconductor creates within the structure of the superconductor an induced current, and a corresponding counter or canceling field which prevents passage of the external field through the superconductor. As the magnitude of the external field acting on the superconductor is increased, the induced current level within the superconductor also increases to generate an increasing counter field. At a certain point, the superconductor can no longer generate additional induced current and counter field, and the external field will penetrate the superconductor shield. The magnitude of the externally applied field sufficient to penetrate the superconductor shield can be termed the critical applied magnetic field value of the shield. Generally, prior shields have exhibited relatively low critical applied magnetic field values, on the order of 30 Gauss (at 77 K) or less.

The critical shielding current density and thus the critical applied magnetic field value of a given superconductor under varying ambient conditions depends on a number of factors: (1) the critical temperature ($T_c$) of the superconductor and its dependence on external magnetic fields; (2) the distribution of magnetic field lines inside the superconductor; (3) the intragrain and intergrain critical current densities ($J_c$) and their dependence on external magnetic fields and temperature; (4) the pinning potential for magnetic fluxoids and the amount of trapped fluxoids in the superconductor; and (5) the connectivity of superconducting grains and the capability of carrying a macroscopic closed-loop supercurrent in the bulk material to screen out and shield external fields.

It has been suggested in the past to employ superconducting shields in various applications, and particularly in conjunction with high sensitivity magnetometers such as SQUIDS (superconducting quantum interference devices). Such SQUIDS require a very low noise working environment, and therefore high performance magnetic shielding exhibiting high critical applied magnetic field values are needed to isolate such devices from external magnetic fields. In the past, low temperature superconducting shields, made from lead or niobium and operating at a temperature of 4 K, have been used for this purpose. Such low $T_c$ shields have an intrinsic noise problem, however, which originates from the fact that they are operated sufficiently closely to the superconducting transition temperature $T_c$ that the temperature variation of the shield's superconducting penetration depth can be appreciable. Unavoidable temperature variations change the penetration depth which in turn causes the trapped field in the shield to fluctuate, thereby generating noise. Use of high temperature superconducting materials whose critical temperature is substantially above the shield operating temperature greatly eliminates this problem. In principle, the much higher transition temperatures make the penetration depth essentially independent of small temperature variations near 4 K. Furthermore, shields constructed from high $T_c$ superconducting material may be feasibly operated at much higher temperatures in the range of liquid nitrogen.

U.S. Pat. No. 5,284,823 to Chou et al. describes a process for forming superconductive bodies by superplastic deformation of YBCO 123 superconducting oxides wherein the starting oxides are initially cold pressed to form a self-sustaining body, heated and then subjected to a stress sufficient to superplastically deform the self-sustaining body into a desired shape. Such deformation of a self-sustaining body requires careful procedures, to avoid fracturing the body.

SUMMARY OF THE INVENTION

The present invention overcomes the problems outlined above, and provides a greatly improved powder molding method for the production of superconducting magnetic shields exhibiting very high critical applied magnetic field values. Broadly speaking, the method includes the steps of providing a quantity of finely divided (e.g., from about 0.5–50 µm) superconducting ceramic material, compressing the material in a die, removing the compressed material from the die, and annealing the compressed material in an oxygen-rich (i.e., greater than 50% by volume oxygen) atmosphere. The improved method of the invention involves heating the die with the finely divided superconducting material therein. External heating of the die has been shown to reduce internal stresses in the final shield, and enhances the critical applied magnetic field value thereof.

In another aspect of the invention, tubular shield bodies may be fabricated using uniaxial pressing techniques with starting superconducting powders, but without the need for die heating.

In more detail, the die heating is preferably carried out during compression of the superconducting material in the die. The heating is normally conducted so as to raise the die temperature up to about 550° C., and more preferably from about 150° to about 550° C. In further embodiments, the die heating is carried out during compression in a cyclic fashion, i.e., the die is successively heated with cool-down periods between each heating. Additionally, it is also preferred to carry out die heating after the material has been compressed. Again, this would normally be up to a temperature of up to about 500° C., and more preferably about 300° to about 500°

C. Such post-compression heating would normally be carried for a period of at least about 30 minutes, and more usually from about 30 to about 180 minutes. Finally, the die components may be preheated before compression if desired, usually up to about 250° C., and more preferably from about 200°–250° C.

During compression of the superconducting material in the die, it is preferred to gradually increase the pressure on the material at a rate of from about 0.5–1 ton/in.$^2$·min. The maximum pressure employed is usually up to about 20 ton/in.$^2$, and more preferably from about 7–15 ton/in.$^2$.

The ceramic oxide is preferably employed as a particle having an average particle size of from about 0.5–50 μm, more preferably from about 1–5 μm. Such a powder can be obtained by use of a jet pulverizer, or for small amounts of material, by using an agate mortar.

A variety of superconducting ceramic oxides can be used in the context of the invention to form magnetic shields. Normally, the oxides should be of the high $T_c$ variety with a critical temperature of at least about 77 K, and more preferably at least about 100 K. Ceramic copper oxide superconductors are of special interest. These may be viewed as the ordered stacking of the cubic structures $RCuO_2$, $MCUO_3$ and $TMCUO_4$, where R is selected from the group consisting of the rare earth metals and calcium, M is selected from the group consisting of barium and stratium, and T is selected from the group consisting of bisthium, thallium and vanadium. These cubic structures can be stacked in a large number of ways, e.g., unit cells may be directly repeated, or can be shifted along the T-O plan and inverse stacked, when the $TMCuO_4$ cubic structure is present. Such techniques will yield superconducting oxides, such as those of the 214, 123, 1201, 2201, 1212, 1223, 2212 and 2223 families of oxides. Although essentially single phase oxides are preferred, multiple phase oxides of the same crystalline family, e.g., mixed phase oxides having Tl-1223 and Tl-2223 phases, or Tl-2223 and Tl-2212 phases, may be used.

In preferred forms, the superconducting ceramic particles used in the fabrication of magnetic shields in accordance with the invention have the general formula $Q_nTl_xBa_zSr_pCa_qCu_bO_{10-y}$ where Q is selected from the group consisting of Rb, Hg, Cr, Re, K, Na, Se and Te, n ranges from 0 to about 0.5, x ranges from about 1–2.5, z ranges from about 0.5–2, p ranges from 0 to about 2, q ranges from about 1.5–3, d ranges from about 3–4, and y is an oxygen deficiency factor which is less than about 1. Particularly preferred is the polycrystalline thallium 2223 oxide wherein n and p are zero, i.e., $Tl_2Ba_2Ca_2Cu_3O_{10-y}$.

It has also been found that a metal selected from the group consisting of gold and silver can be mixed with the superconducting ceramic material to give enhanced magnetic shields. The most preferred metal for reasons of cost is elemental silver in particulate form (e.g., 99.9% pure elemental silver having an average particle size of from about 0.7 to about 1.3 μm); however, the oxides of these metals and particularly silver can also be used. Generally, the metal should be present in the shield at a level of from about 3–20% by weight, and more preferably from about 5–10% by weight. The presence of silver or gold improves the life of the shield under thermal cycling.

The final annealing step in the fabrication of the shields of the invention involves annealing at a temperature of from about 820°–890° C. for a period of about 10 to about 20 hours, and then reducing this temperature to a level of from about 550° to about 650° C. for a further period of from about 5 to about 10 hours. The initial rate up to the annealing temperature should be from about 0.2 to about 0.5° C./min., whereas the cooling rate from the annealing temperature to the intermediate temperature is generally at a rate of from about 1° C./min. The final cooling rate down to room temperature should be from about 2 to about 10° C./min.

The final shields produced in accordance with the invention are in the form of self-sustaining bodies and have critical applied magnetic field values of at least about 50 Gauss at 77 K, and more preferably at least about 60 Gauss at 77 K. The magnetic shielding factor attenuation rate (Attenuation [dB]=–20 ln [$B_i/B_a$] where $B_i$ is the detected field inside the shield at the geometric center thereof and $B_a$ is the external applied field) is in the range of from about 40 to about 180 dB. Although a variety of shield shapes are possible, tubular shields (with or without end caps) are preferred; such tubular shields normally have an inside diameter of from about 8 to about 100 mm, a length form about 20 to about 300 mm, and a wall thickness from about 0.5 to about 10 mm. Surface coating with metal or polymer sometimes is applied to improve the life of the shield.

It will be understood that the methods of the present invention pertain to powder molding of initially particulate material, as opposed to stress-deformation of a self-sustaining body.

DETAILED DESCRIPTION OF THE PREFERRED EMBODIMENTS

Figures 1, 2:
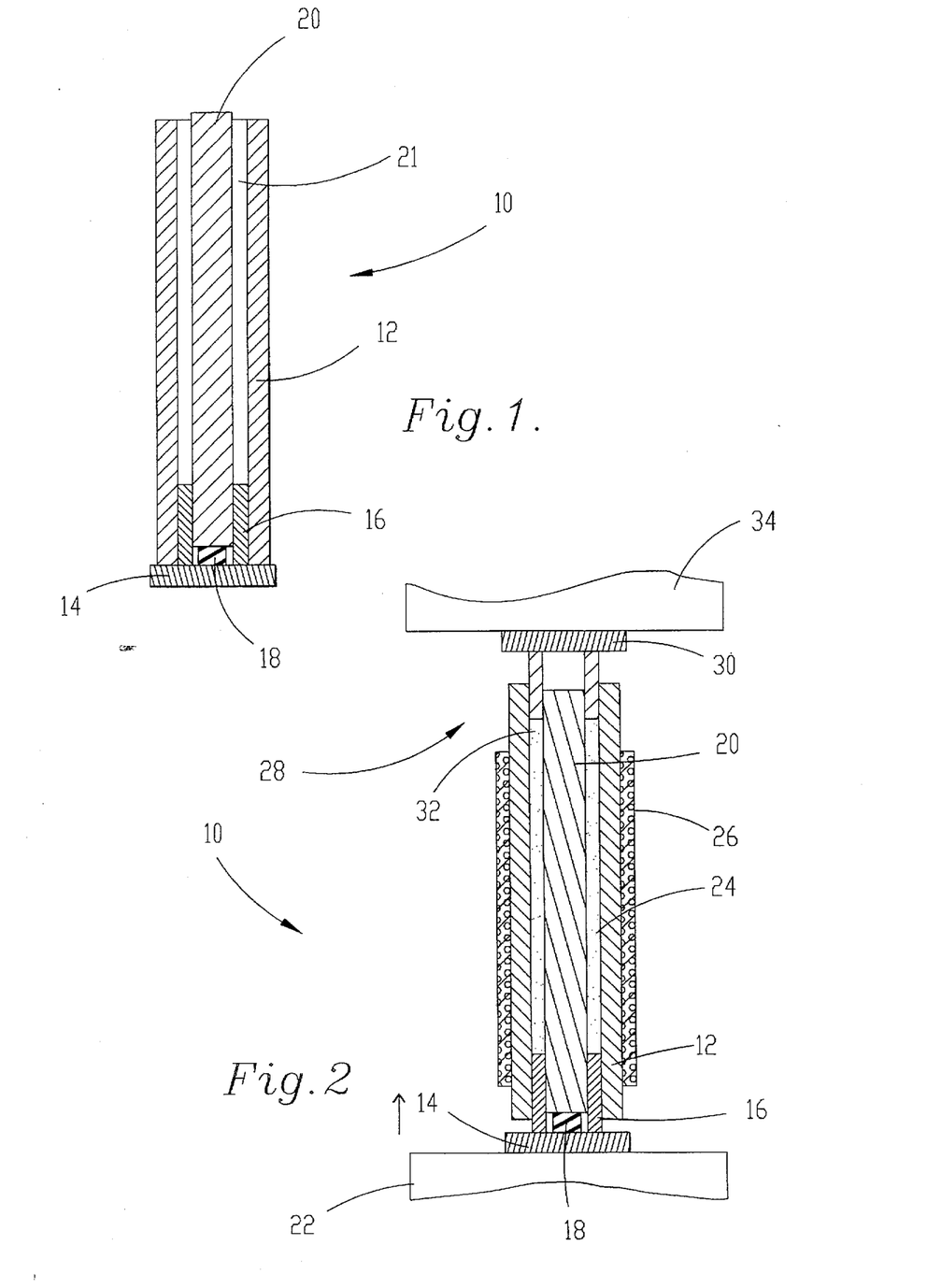
FIG. 1 is a sectional view illustrating the configuration of the preferred die assembly for use in creating tubular superconducting magnetic shields in accordance with the invention.
FIG. 2 is a sectional view similar to that of FIG. 1, but illustrating the die assembly in use during compaction of superconducting particles into a self-sustaining tubular magnetic shield, with an external heating jacket being applied to the die.

Turning now to the drawings, and particularly FIG. 1, a die assembly 10 for use in the invention is broadly illustrated. The die assembly 10 includes an upright tool steel tubular sidewall 12 supported on a tool steel base 14. A tubular tool steel spacer 16 is positioned within sidewall 12 as illustrated. A rubber washer 18 is located within the spacer 16 as shown, and supports an upright internal rod 20, also formed of tool steel. It will be observed that the rod 20 is essentially coaxial with the outer sidewall 12, and cooperatively defines therewith an annular zone 21.

FIG. 2 depicts the die assembly 10 in use during compression-forming of a tubular, self-sustaining body formed of particles of superconducting oxide material. In particular, it will be observed that the base 14 is positioned on a press platen 22, and that particulate superconducting oxide powder 24 fills the annular space 21. An electrical resistance jacket heater 26 is applied to the outer surface of sidewall 12 as shown, and a top assembly 28 interfits with the upper end of the die assembly. Specifically, the top assembly includes a block 30 as well as a depending tubular insert 32 which fits within annular zone 21 and contacts the upper surface of the powder 24. Finally, a press head 34 engages the upper surface of block 30 remote from the die assembly.

In actual practice, the FIG. 2 structure is used to gradually compress the powder 24 within zone 21, while the heating jacket 26 applies external heating to the die. The specific preferred compression and temperature parameters have been described above.

Figures 3, 4:
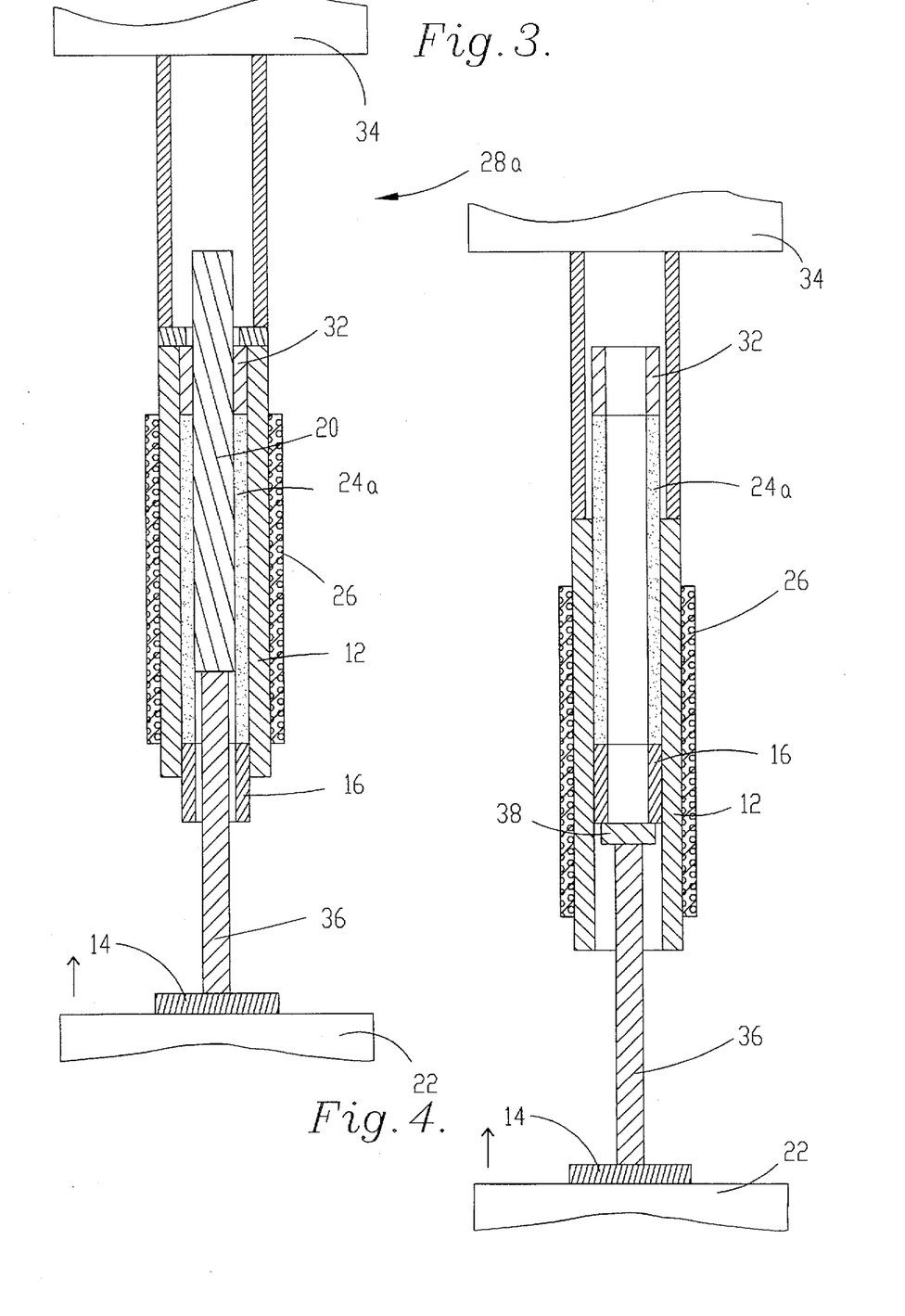
FIG. 3 is a sectional view illustrating removal of the central rod element of the die assembly.
FIG. 4 is a view similar to that of FIG. 3, but depicts the technique for removing the tubular shield from the die assembly.

FIG. 3 illustrates use of the FIG. 2 structure during removal of the rod 20, after a self-sustaining compressed body 24a has been formed from the originally particulate powder 24. To this end, a longer top assembly 28a is used, along with a tool steel ring 35 and a separate extraction rod 36. The platen 22 is then moved in the direction shown so as to push the central rod 20 out of sidewall 12. At this point, in preferred practice, the body 24a still housed within the sidewall 12, is subjected to the previously described, post-compression heating step.

FIG. 4 illustrates the technique employed for removing the self-sustaining, heat treated body 24a from the confines of sidewall 12. A stainless steel plug rod 38 is positioned between the upper end of extraction rod 36 and the underside of spacer 16, and the platen 22 is again moved so as to push the body 24a out of sidewall 12 as illustrated.

The body 24a is then subjected to annealing in a tube furnace. Attention is specifically directed to FIG. 5 which illustrates in schematic form a furnace 40 having a tube 42 therein which extends through the furnace walls. The tube 42 is equipped with end caps 44, 46, with each of the latter having an oxygen tube 48, 50 therein. Oxygen from a source is connected to the outer end of tube 50, for flow through tube 42. This oxygen exits tube 42 through small end cap-mounted tube 48 for filtration. The body 24a is placed within an alumina crucible 52 for annealing. In the case of large sized tubes having an inside diameter greater than 50 mm, the diameter of the surrounding alumina crucible should closely conform with the body 24a to prevent deformation during annealing. Sometimes silver or stainless steel foil may be used to fill any gaps between the alumina crucible and the body 24a, in order to insure that all gaps are less than 1 mm. When a cylindrical shield having a diameter greater than about 2 inches is being annealed, it is preferred to rotate the furnace tube 42 at a speed of about 1–5 revolutions/hour. This creates a more uniform heat distribution and reduces or eliminates deformation of the shield during annealing.

It is also contemplated that end caps formed of superconducting ceramic material can also be formed for use with the final annealed shields of the invention. These end caps of different shapes are formed in the same manner as described above. For tubular shields, they are in the form of circular solid bodies sized to fit within the ends of the tubes. As necessary, the end caps and the tubular bodies may be trimmed using a lathe for final fitting between the end caps and the tubular sections.

The following examples set forth a preferred technique for the production of superconducting shields in accordance with the invention. It should be understood, however, that these examples are being provided by way of illustration only, and nothing therein should be taken as a limitation upon the overall scope of the invention.

EXAMPLE 1

In this example, a superconducting shield was fabricated using $Tl_2Ba_2Ca_2Cu_3O_{10-y}$ superconducting ceramic oxide material having a $T_c$ of 124 K and a phase purity of greater than 95%. This material was fabricated by the technique described in PCT published application WO 93/10047 published May 27, 1993; this publication is incorporated by reference herein. The pellets resulting from this fabrication were broken into particles of approximately 1 mm in size using a tool steel container with a hydraulic press. These particles were then ground in an agate mortar, giving a final particle size in the range of from about 1 to about 5 µm.

The uniaxial die 10 illustrated in FIGS. 1–2 was employed to create the self-sustaining tubular shield. In particular, the main tubular sidewall 12 of the die and the internal, coaxial rod 20 were heated to 250° C. using a hot plate. The inside surface of the tubular sidewall and the outer surface of the rod were then coated with floor wax. These heated parts were assembled as illustrated in FIG. 1, using the spacer 16 and base 14 as illustrated. The annular space 21 between the inner rod and outer tubular sidewall was then filled with the previously made superconducting ceramic powder 24, using a hammer to lightly tap the tubular sidewall 12 to insure even filling.

After the annular region 21 of the die was filled, the hydraulic press (FIG. 3) was employed, including the external band heater jacket 26. The uniaxial pressure applied was gradually increased at a rate of 0.5 ton/in.$^2$·min. to a maximum pressure of 8 tons/in$^2$, which was held for a period of 10 minutes and then reduced to zero over another 10 minute period. During this sequence, die heating to 180° C. was carried out using the heater jacket 26.

After die pressing, the internal rod 20 was removed as illustrated in FIG. 3. The tubular die containing the pressed superconductive body 24a was then reheated using the external heating jacket 26 to 220° C., and maintained at this temperature for 50 minutes. At this point, the pressed and heated tubular body 24a was removed from the die by pressing, as specifically illustrated in FIG. 4.

Figure 5:
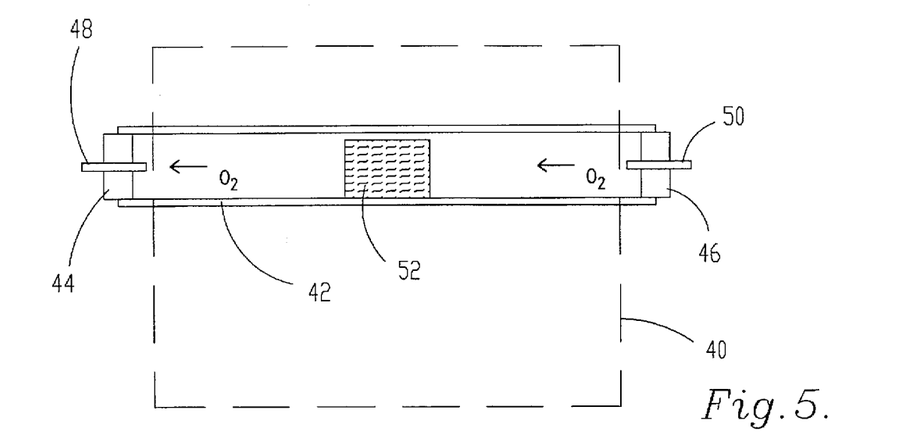
FIG. 5 is a schematic view illustrating the annealing process followed in the fabrication of the shields of the invention.
Figure 6A:
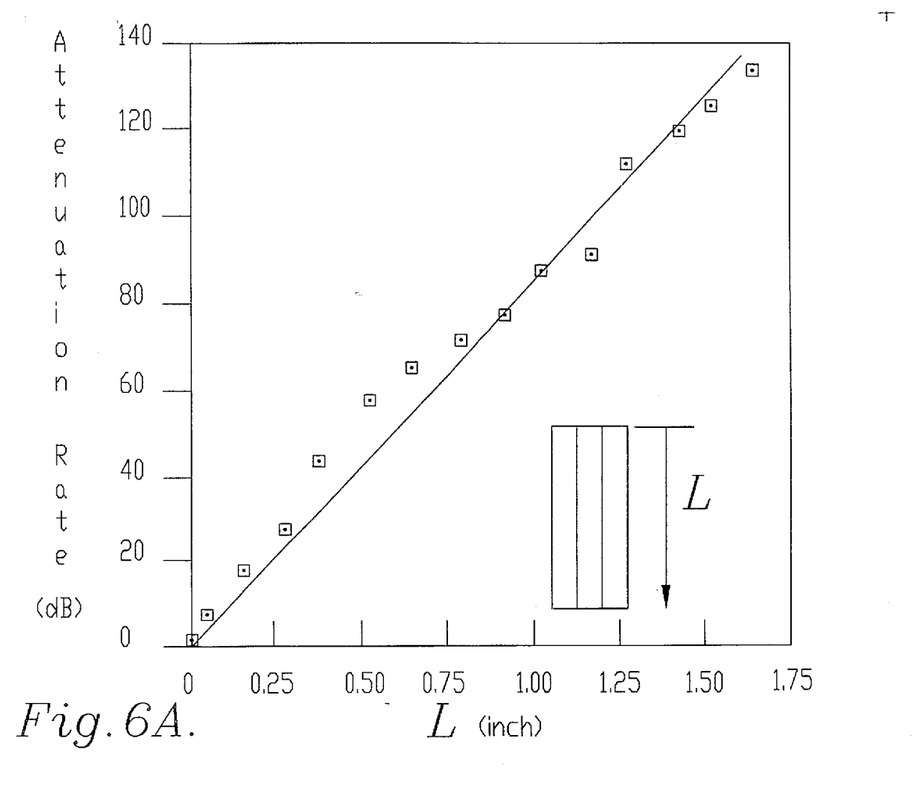
FIG. 6A is a representative graph of applied magnetic field versus internal detected magnetic field, and illustrating the high critical applied magnetic field values characteristic of the shields of the invention.
Figure 6B:
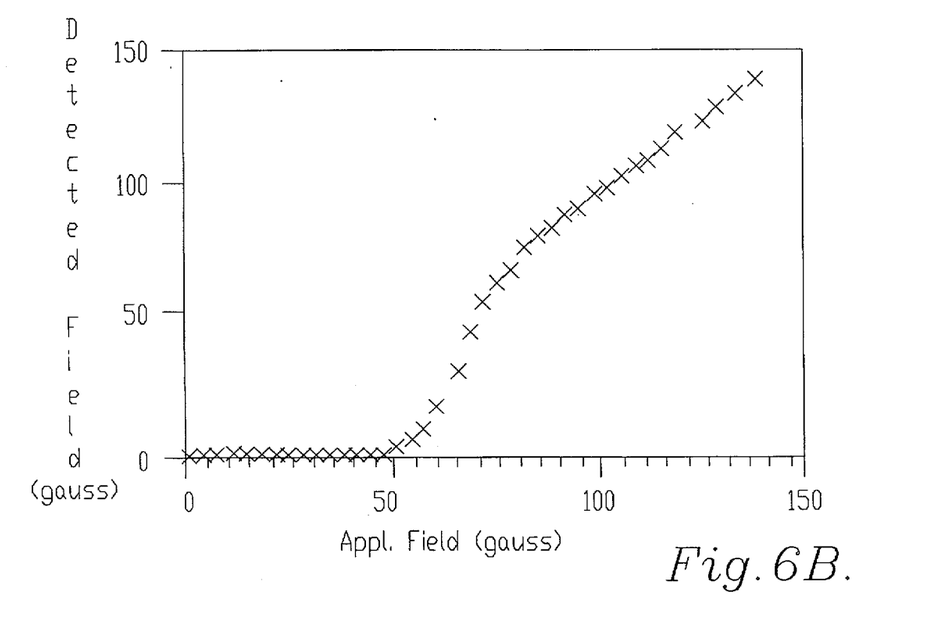
FIG. 6B is a graph of shield length versus attenuation rate for shields in accordance with the invention.

The tubular shield body 24a was then placed in a conforming alumina crucible 52 and the latter was positioned within a tube furnace 42 equipped with endmost caps 44, 46 having oxygen entrance and exit tubes 48, 50 (see FIG. 5). The temperature of the furnace was raised at the rate of 0.25° C./min. from room temperature to 890° C., and was kept at this temperature for 10 hours. The furnace temperature was then reduced at the rate of 1° C./min. to 600° C., and maintained at this temperature for 10 hours. Finally, the furnace was cooled to room temperature at a rate of 5° C./min.

The inside diameter of the resultant tubular shield was 15 mm, and the wall thickness thereof was 5 mm. The length of the shield was 95 mm.

Figure 7:
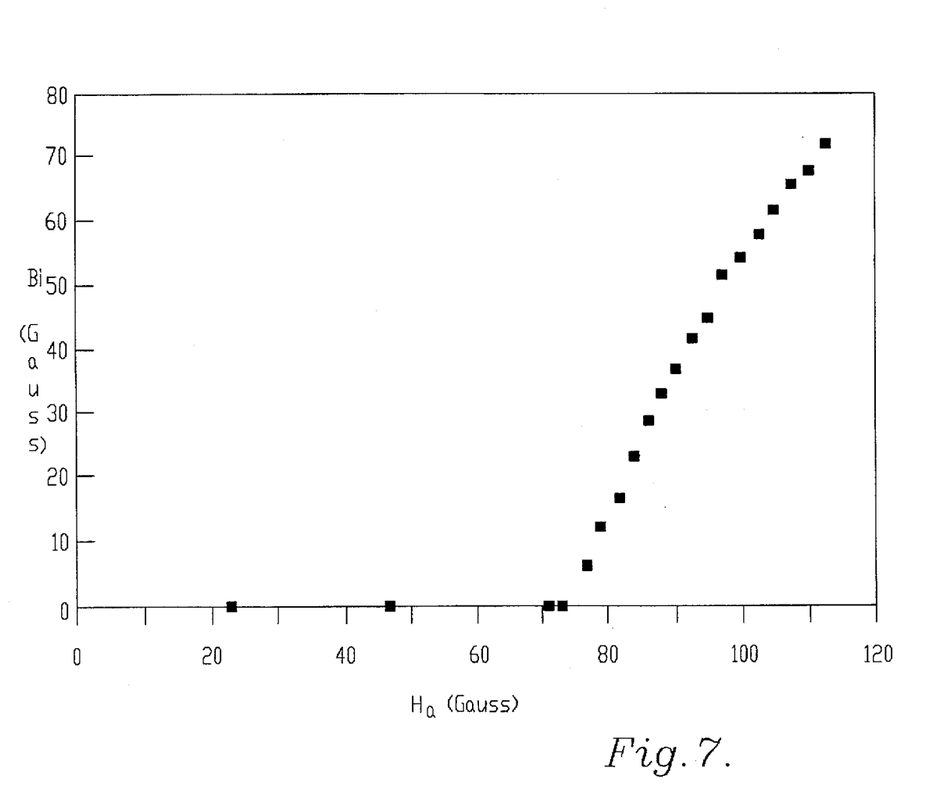
FIG. 7 is a graph of applied magnetic field versus internal detected magnetic field for the specific shield described in the Example.

The magnetic shielding factor attenuation rate of the shield was found to be 120 dB at 77 K at a DC field of 10 Gauss. The shield exhibited a critical magnetic field value of 73 Gauss at 77 K. FIG. 7 illustrates the measured curve for the applied critical field of the shield.

EXAMPLE 2

Powder Preparation $Tl_2Ba_2Ca2Cu_3O_{10-y}$ superconducting material with $T_c(zero)=124$ K and phase purity>95% was used as starting material. The superconductor pellets were broken into particles of size of 1 mm in a tool steel container with a hydraulic press. The particles were then ground with an agate mortar. The average particle size of the final powder was in the range of 1–5 μm. Silver powder with purity of >99% and particle size of 0.7–1.3 μm was next uniformly mixed with the superconductor powder. The ratio of the weight of Ag to the weight of the superconductor powder was 1/9. The mixed powder was then uniaxiallay presssed in die 10 to create a self-sustaining shield, in the manner of Example 1.

Heat Treatment

This resultant tube was put in an alumina tube, and the alumina tube then was placed in a tube furnace. Oxygen was directed through the tube furnace during annealing. The temperature of the furnace was raised at the rate of 0.40/min. from room temperature to 825° .C, then was kept at 825° C. for 10 hours. The furnace temperature was then reduced at a rate of 1°/min. to 600° C. and maintained at this temperature for 5 hours. Finally, the furnace was cooled to room temperature at a rate of 5° C.

The Dimension of the Superconducting Shield

The inside diameters (ID) of the resulting shield was 15 mm. The wall thickness of the shield (T) was 5 mm. The length of the shield was 75 mm.

Measurement Result

The magnetic shielding factor-attenuation rate of this shield was 83 dB at 77 K at a DC field of 10 Gauss. The critical applied magnetic field value of the shield was 54 Gauss.

EXAMPLE 3

Figures 8, 9, 10:
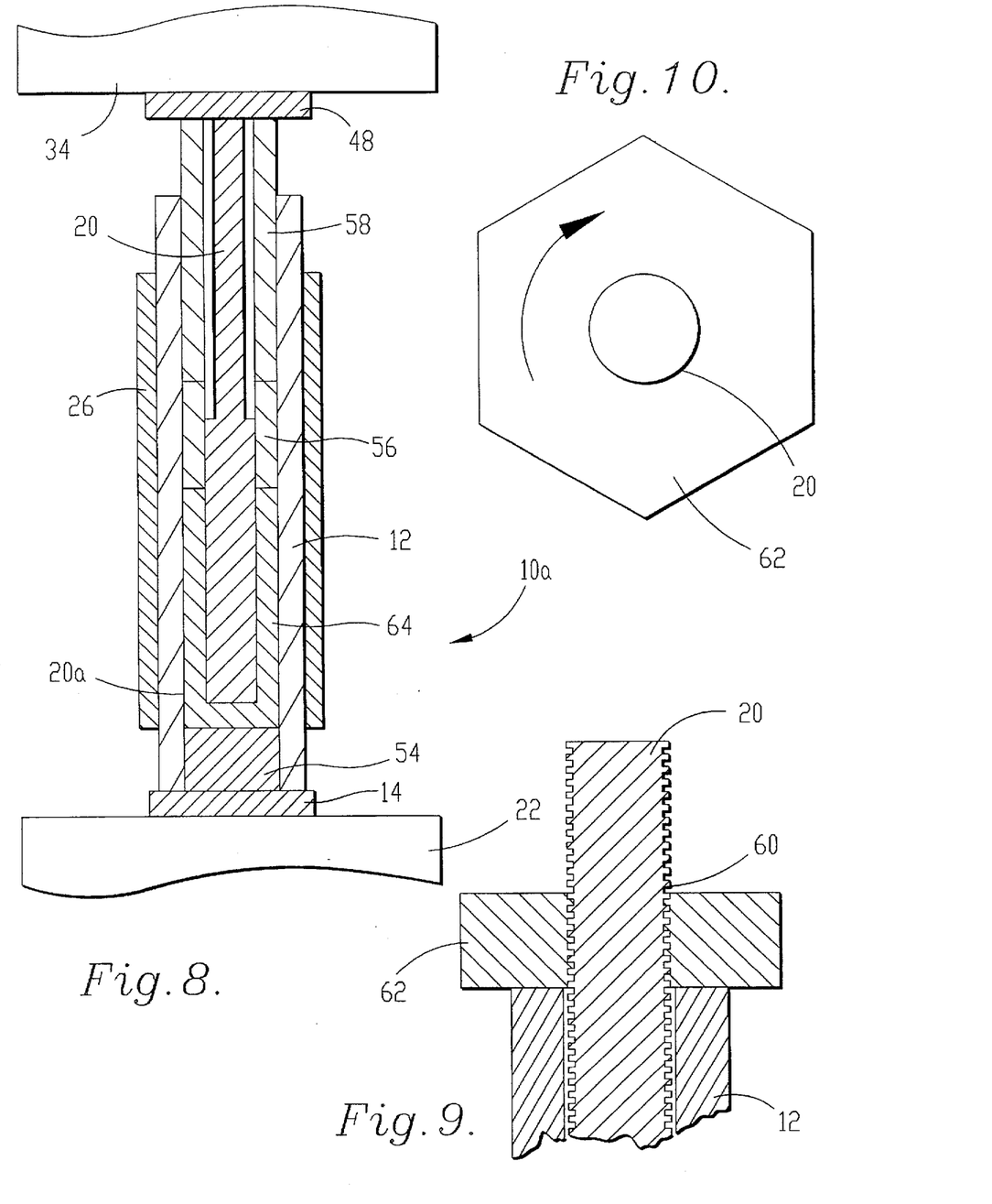
FIG. 8 is a sectional view illustrating another die assembly useful in the production of closed-ended tubular shields.
FIG. 9 is a fragmentary vertical sectional view illustrating removal of the internal rod of the assembly of FIG. 8 prior to removal of the powder molded shield within the die.
FIG. 10 is a plan view of the apparatus illustrated in FIG. 9.

In this Example, a closed-ended shield was fabricated using the apparatus illustrated in FIGS. 8–10. This apparatus is similar in many respects to that depicted in FIGS. 1–4, and where possible corresponding reference numerals have been used.

In particular, FIG. 8 illustrates a die assembly 10a including an upright tool steel tubular sidewall 12 supported on a tool steel base 14. A cylindrical tool steel spacer 54 is positioned within sidewall 12 as illustrated. An internal rod 20 is located within and is substantially coaxial with sidewall 12 and defines with the latter an annular zone. A pair of annular, superposed blocks 56 and 58 are designed to fit within the annular zone between rod 20 and sidewall 12 during powder forming of a shield body as will be explained. The lowermost face 20a of the rod 20 is substantially parallel with the upper face of spacer 54 and defines therewith a transverse region in communication with the aforementioned annular zone.

The upper end of rod 20 has a threaded external surface 60 as best seen in FIG. 9. An annular, internally threaded block 62 receives the threaded end of rod 20 and abuts the upper end of sidewall 12. Again referring to FIG. 8, it will be observed that the assembly 10a is positioned between a press head 34 and platen 22. In order to effect the desired heating of the die assembly, an electrical resistance jacket heater 26 is applied to the outer surface of sidewall 12 as shown.

In this Example, $Tl_2Ba_2Ca_2Cu_3O_{10-y}$ superconducting oxide pellets with $T_c(zero)=124$ K and phase purity>95% was used as a starting material. The pellets were first broken into particles of size of 1 mm in a tool steel container with a hydraulic press. The particles were then ground using an agate mortar. The particle size of the final powder was in the range of 1–5 μm.

In the next step, die assembly parts 12 and 20 were heated to 250° C. on a hot plate. The inside surface of the die sidewall 12 and the outer surface of the rod 20 were then coated with floor wax. The die assembly 10a was then partially constructed as shown in FIG. 9 by appropriate placement of base 14, sidewall 12, heater 26, spacer 54 and rod 20. The powder was then filled into the annular region between the rod 20 and sidewall 12, and between the surface 20a of rod 20 and the upper surface of spacer 54. In FIG. 8, the region filled with powder is referred to by the numeral 64. The die was gently tapped with a hammer to insure even filling of this region.

Next, the tubular parts 56 and 58 were positioned within the sidewall 12 atop the powder fill, and threaded block 62 was threaded onto the upper threaded end of rod 20 until the block 62 abutted the upper end of tubular die part 58.

Uniaxial hydraulic pressure was then applied through press head 34 bearing against block 62. The pressure was increased at a rate of 3 ton/in.$^2$. min., and the maximum pressure used for forming was 8 tons/in$^2$. The maximum pressure was retained for 30 minutes and thereafter the pressure was gradually reduced to zero over a 2 minute period. During pressing, band heater 26 was used to heat the die assembly to 180° C.

After the pressing/heating step, the die assembly 10a containing the compressed, closed-ended shield body was positioned on a bench clamp. The rod 20 was carefully removed by appropriate rotation of block 62 as illustrated in FIGS. 9–10. Thereafter, the upper die parts 58 was carefully removed, and the compressed shield together with the rod 20 and spacer 54 were removed in the manner described with reference to FIG. 4.

The compressed shield body was then placed in an alumina tube, and the latter was positioned in a tube furnace. Oxygen was passed into the furnace tube during the annealing process, which was carried out using an ascending temperature rate of 5° C./min. from room temperature to 500° C., whereupon the heating rate was reduced at a rate of 0.25° C./min. until the furnace temperature was 885° C. The temperature was kept at 885°–890° C. for 10 hours. The furnace temperature was then reduced at a rate of 1° C./min. to 650° C. and maintained at this temperature for 10 hours. Finally, the furnace was cooled to room temperature at a descending rate of 5° C./min.

The inside diameter of the resultant shield was 24.7 mm with the tubular wall thickness being 5.2 mm. The shield had a length of 82 mm and the thickness of the closed bottom thereof was 6 mm. The magnetic shielding factor-attenuation rate for this shield was 130 dB at 77 K at a DC field of 30 Gauss. The critical applied magnetic field value at 77 K was 100 Gauss.

The term "about" used with reference to ranges herein should be understood to mean that both the upper and lower limits of the range are approximate.

We claim:

1. A superconducting magnetic shield comprising a self-sustaining body formed by uniaxial compression of superconducting ceramic particles in a compression chamber defined in part by circumscribing shape-retaining solid wall structure disposed about said particles, said uniaxial compression being carried out while said solid wall structure retains the shape thereof, said shield having a critical applied magnetic field value of at least about 50 Gauss at 77 K and having a shielding factor attenuation rate of from about 40 to about 180 dB, and said body having a thickness of from about 0.5–10 mm, and said particles including Tl-containing high $T_c$ superconducting ceramic particles.

2. The shield of claim 1, said shield including therein metal particles selected from the group consisting of gold and silver.

3. The shield of claim 2, said metal particles being elemental silver.

4. The shield of claim 2, said metal particles being present at a level of from about 3–20% by weight.

5. The shield of claim 1, said shield including an elongated, tubular wall portion.

6. The shield of claim 5, said shield being in the form of an open-ended tube.

7. The shield of claim 1, said superconducting ceramic particles having the general formula $$Q_n Tl_x Ba_2 Sr_p Ca_q Cu_d O_{10-y}$$

where Q is selected from the group consisting of Rb, Hg, Cr, Re, K, Na, Se and Te, n ranges from 0 to about 0.5, x ranges from about 1–2.5, z ranges from about 0.5–2, p ranges from about 0–2, q ranges from about 1.5–3, d ranges from about 3–4, and y is an oxygen deficiency factor which is less than about 1.

8. The shield of claim 7, wherein n and p are zero.

9. The shield of claim 1, wherein said superconducting ceramic particles comprise polycrystalline thallium 2223 particles.

10. The shield of claim 1, said shield being tubular with an inside diameter of from about 8 to about 100 mm, a length of from about 20 to about 300 mm, and a wall thickness of from about 1 to about 10 mm.

11. A method of fabricating a tubular, self-sustaining superconducting magnetic shield comprising the steps of:

providing a quantity of finely divided tl-containing superconducting ceramic material having an average particle size of from about 0.5–50 µm;

placing said finely divided superconducting material into the cavity of a tubular die presenting an elongated, tubular, material-receiving chamber defined in part by circumscribing shape-retaining solid wall structure disposed about said material and presenting a longitudinal compression axis, and a complemental, elongated tubular pressing member;

heating said die with said material therein, and substantially uniaxially compressing said finely divided superconducting material within said die cavity by pressing said pressing member against said material to form a compressed body within the die cavity having a thickness of from about 0.5–10 mm, said compressing step comprising the steps of maintaining the shape of said circumscribing wall structure during said pressing of said pressing member and gradually increasing the substantially uniaxial pressure on said material to a maximum pressure of from about 7–15 tons/in$^2$; and removing the compressed tubular body from the die and annealing the compressed body in an oxygen-rich atmosphere.

12. The method of claim 11, including the step of carrying out said die heating during said compression of said material.

13. The method of claim 12, including the step of heating said die to a temperature of up to about 550° C.

14. The method of claim 13, said temperature ranging from about 150°–550° C.

15. The method of claim 12, including the step of successively heating said die, and allowing the die to cool, during said compression.

16. The method of claim 11, including the step of carrying out said die heating after said material has been compressed.

17. The method of claim 16, including the step of heating said die to a temperature of up to about 500° C.

18. The method of claim 17, said temperature ranging from about 300°–500° C.

19. The method of claim 16, including the step of carrying out said heating for at least about 30 minutes.

20. The method of claim 19, said time being from about 30–180 minutes.

21. The method of claim 11, including the step of gradually increasing the pressure on said material during said compression step at a rate of from about 0.5–1 ton/inch$^2$·min.

22. The method of claim 11, including the step of preheating said die before said compression step.

23. The method of claim 22, wherein said die is preheated to a temperature of up to about 500° C.

24. The method of claim 23, said temperature ranging from about 300°–500° C.

25. The method of claim 11, wherein said finely divided material has an average particle size of from about 1–5 µm.

26. The method of claim 11, wherein a metal selected from the group consisting of gold and silver is mixed with said finely divided ceramic material.

27. The method of claim 26, said metal being elemental silver.

28. The method of claim 26, said metal being present in said shield at a level of from about 3–20% by weight.

29. The method of claim 11, including the steps of first annealing said compressed material at a temperature of from about 840°–890° C. for a period of from about 10–20 hours, and then reducing said temperature to a level of about 550°–650° C. for a period of from about 5–10 hours.

30. A method of fabricating a tubular, self-sustaining superconducting magnetic shield comprising the steps of:

providing a quantity of finely divided Tl-containing superconducting ceramic material having an average particle size of from about 0.5–50 µm;

placing said finely divided superconducting material into a die presenting an elongated, tubular material-receiving chamber defined in part by circumscribing shape-retaining solid wall structure disposed about said material and presenting a longitudinal compression axis, and a complemental, elongated, tubular pressing member;

substantially uniaxially compressing said finely divided superconducting material by compressively engaging said member with said finely divided superconductive material within said die chamber and exerting a compressive force by pressing said pressing member against said material to form a compressed, tubular body within the die, said compressing step comprising the steps of maintaining the shape of said circumscribing wall structure during said pressing of said pressing member and gradually increasing the substantially uniaxial pressure on said material to a maximum pressure of from about 7–15 tons/in$^2$; and removing the compressed, tubular body from the die and annealing the compressed, tubular body in an oxygen-rich atmosphere to form a self-sustaining tubular magnetic shield, said tubular body having a wall thickness of from about 0.5–10 mm.

31. The method of claim 30, including the step of heating said die with said material therein.

* * * * *